(12) United States Patent
Bang et al.

(10) Patent No.: US 9,208,068 B2
(45) Date of Patent: Dec. 8, 2015

(54) DATA STORAGE DEVICES INCLUDING MULTIPLE HOST INTERFACES AND USER DEVICES INCLUDING THE SAME

(71) Applicant: Samsung Electronics Co., Ltd., Suwon-si (KR)

(72) Inventors: Hyo-Jae Bang, Hwaseong-si (KR); JoonHee Lee, Yongin-si (KR); JinHyuk Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 149 days.

(21) Appl. No.: 13/749,284

(22) Filed: Jan. 24, 2013

(65) Prior Publication Data

US 2013/0205064 A1    Aug. 8, 2013

(30) Foreign Application Priority Data

Feb. 6, 2012 (KR) .................. 10-2012-0011925

(51) Int. Cl.
| | |
|---|---|
| *G06F 12/00* | (2006.01) |
| *G06F 12/02* | (2006.01) |
| *G06F 3/06* | (2006.01) |
| *H05K 3/28* | (2006.01) |

(52) U.S. Cl.
CPC .......... *G06F 12/0238* (2013.01); *G06F 3/0611* (2013.01); *G06F 3/0658* (2013.01); *G06F 3/0688* (2013.01); *H05K 3/284* (2013.01)

(58) Field of Classification Search
None
See application file for complete search history.

(56) References Cited

U.S. PATENT DOCUMENTS

| | | | | |
|---|---|---|---|---|
| 5,334,952 | A  * | 8/1994 | Maddy et al. ................ | 331/1 A |
| 7,297,914 | B2 | 11/2007 | Pang et al. | |
| 7,517,252 | B2 | 4/2009 | Ni et al. | |
| 7,685,374 | B2 | 3/2010 | Diggs et al. | |
| 7,869,218 | B2 | 1/2011 | Ni et al. | |
| 7,873,619 | B1 | 1/2011 | Faibish et al. | |
| 7,902,530 | B1 | 3/2011 | Sahadevan | |
| 8,626,994 | B2 * | 1/2014 | Seroff et al. ................... | 711/103 |
| 2001/0018727 | A1 * | 8/2001 | Ando et al. .................... | 711/112 |
| 2003/0057515 | A1 * | 3/2003 | Fillion et al. .................. | 257/508 |
| 2004/0105240 | A1 * | 6/2004 | Haba et al. .................... | 361/752 |
| 2008/0037642 | A1 | 2/2008 | Tsuchiya et al. | |
| 2008/0200041 | A1 | 8/2008 | Lin et al. | |
| 2009/0240873 | A1 * | 9/2009 | Yu et al. ........................ | 711/103 |
| 2009/0303783 | A1 | 12/2009 | Lowrey | |
| 2010/0020515 | A1 | 1/2010 | Rubino et al. | |
| 2010/0073860 | A1 | 3/2010 | Moriai et al. | |
| 2010/0259882 | A1 | 10/2010 | Song | |
| 2011/0167201 | A1 | 7/2011 | Huang | |

FOREIGN PATENT DOCUMENTS

| | | |
|---|---|---|
| JP | 2009289277 A | 12/2009 |
| KR | 1020060000124 A | 1/2006 |
| KR | 100964152 B1 | 6/2010 |
| KR | 1020100115268 A | 10/2010 |

* cited by examiner

*Primary Examiner* — Cheng-Yuan Tseng
*Assistant Examiner* — Craig Goldschmidt
(74) *Attorney, Agent, or Firm* — Myers Bigel Sibley & Sajovec, P.A.

(57) ABSTRACT

Disclosed is an information storing device which includes a first interface for connection with a host; a second interface for connection with the host; a first memory unit including a first controller controlling a first nonvolatile memory, the first controller communicating with the host via the first interface; and a second memory unit including a second controller controlling a second nonvolatile memory, the second controller communicating with the host via the second interface.

20 Claims, 9 Drawing Sheets

DATA STORAGE DEVICES INCLUDING MULTIPLE HOST INTERFACES AND USER DEVICES INCLUDING THE SAME

CROSS-REFERENCE TO RELATED APPLICATIONS

A claim for priority under 35 U.S.C. §119 is made to Korean Patent Application No. 10-2012-0011925 filed Feb. 6, 2012, in the Korean Intellectual Property Office, the entire contents of which are hereby incorporated by reference.

BACKGROUND

The inventive concepts described herein relate to an information storing device and a user device using the same.

Information storing devices may use volatile or non-volatile semiconductor memory devices.

Nonvolatile semiconductor memory devices can be of different types such as a mask read-only memory (MROM), a programmable read-only memory (PROM), an erasable programmable read-only memory (EPROM), an electrically erasable programmable read-only memory (EEPROM), and the like.

Solid state drives (SSDs) have been developed to replace hard disk drives (HDDs) using nonvolatile memory devices. The SSD can provide high speed and stability in a relatively small package by replacing a mechanical component of the HDD with the nonvolatile memory device.

SUMMARY

One aspect of embodiments of the inventive concept is directed to provide an information storing device which can include a first interface for connection with a host and a second interface for connection with the host. A first memory unit can include a first controller to control a first nonvolatile memory; the first controller can communicate with the host via the first interface and a second memory unit, including a second controller to control a second nonvolatile memory, where the second controller can communicate with the host via the second interface.

In example embodiments, the first memory unit can further include a first buffer memory that temporarily stores data received from the host, and the second memory unit can further include a second buffer memory that temporarily stores data received from the host.

In example embodiments, the information storing device can be a solid state drive. In example embodiments, the first interface can be a serial ATA interface.

Another aspect of embodiments of the inventive concept is directed to provide an information storing device which can include a first interface connected with a host and is formed at one side of a printed circuit board. A second interface can be connected with the host and formed at the one side of the printed circuit board. A first memory unit can be mounted on the printed circuit board and include a first controller to control a first nonvolatile memory, the first controller can communicate with the host via the first interface. A second memory unit can be mounted on the printed circuit board and can include a second controller to control a second nonvolatile memory, where the second controller can communicate with the host via the second interface.

In example embodiments, the first and second interfaces are formed at the same lateral surface of the printed circuit board in a layered manner.

In example embodiments, the first and second interfaces are formed of a TAB.

In example embodiments, the first and second memory units are mounted on the same surface of the printed circuit board.

In example embodiments, the first and second memory units are mounted on opposite surfaces of the printed circuit board, respectively.

In example embodiments, the first memory unit can further include a first buffer memory that temporarily stores data received from the host, the first controller, the first nonvolatile memory, and the first buffer memory being integrated in a first package, and the second memory unit can further include a second buffer memory that temporarily stores data received from the host, the second controller, the second nonvolatile memory, and the second buffer memory can be integrated in a second package.

In example embodiments, the first memory unit further includes a first buffer memory that temporarily stores data received from the host, the first controller, the first nonvolatile memory, and the first buffer memory can be packaged separately, and the second memory unit can further include a second buffer memory that temporarily stores data received from the host, the second controller, the second nonvolatile memory, and the second buffer memory can be packaged independently.

In example embodiments, the first memory unit further includes a first buffer memory that temporarily stores data received from the host, the first controller, the first nonvolatile memory, and the first buffer memory can be packaged independently, and the second memory unit can further include a second buffer memory that temporarily stores data received from the host, the second controller, the second nonvolatile memory, and the second buffer memory can be integrated in a single package.

In example embodiments, the first memory unit is used as a main memory and the second memory unit is used as a booting memory.

Still another aspect of embodiments of the inventive concept is directed to provide a, user device which comprises an information storing device and a host communicating with the information storing device. The information storing device can include first and second interfaces for connection with the host where a first memory unit can include a first nonvolatile memory and a first controller to control the first nonvolatile memory, the first controller can communicate with the host via the first interface. A second memory unit can include a second nonvolatile memory and a second controller to control the second nonvolatile memory, the second controller can communicate with the host via the second interface.

In example embodiments, the first memory unit further includes a first buffer memory that can temporarily store data received from the host via the first interface. The second memory unit can further include a second buffer memory that temporarily stores data received from the host via the second interface. The first memory unit and the second memory unit can be packaged separately.

In example embodiments, an information storing device can include a first interface, on a printed circuit board, that can be configured to connect with a host that is external to the information storing device. A second interface, on the printed circuit board, can be spaced apart from the first interface and configured to separately connect with the host. A first memory unit can be on the printed circuit board and include a first nonvolatile memory, where the first memory unit is configured to communicate with the host via the first interface. A second memory unit can be on the printed circuit board and include a second nonvolatile memory, where the first memory unit can be configured to communicate with the host via the second interface simultaneously with communication between the host and the first memory unit.

In example embodiments, the first and second interfaces are spaced apart along a first edge of the printed circuit board. In example embodiments, the first and second memory units are mounted on a first side of the printed circuit board.

In example embodiments, the first and second memory units are mounted on opposite sides of the printed circuit board. In example embodiments, the first and second interfaces can be tape automated bonding interfaces.

In example embodiments, the device can further include a third interface, on the printed circuit board, that is configured to connect with the host. A fourth interface can be on the printed circuit board, and be spaced apart from the third interface and configured to separately connect with the host, where the third and fourth interfaces are spaced apart along a second edge of the printed circuit board. A third memory unit can be on the printed circuit board, and include a third nonvolatile memory, where the third memory unit can be configured to communicate with the host via the third interface. A fourth memory unit can be on the printed circuit board and including a fourth nonvolatile memory, the fourth memory unit can be configured to communicate with the host via the fourth interface simultaneously with communication between the host and the first, second, and third memory units.

In example embodiments, the third and fourth memory units are mounted on a first side of the printed circuit board. In example embodiments, the third and fourth memory units are mounted on opposite sides of the printed circuit board. In example embodiments, the third and fourth interfaces comprise tape automated bonding interfaces.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
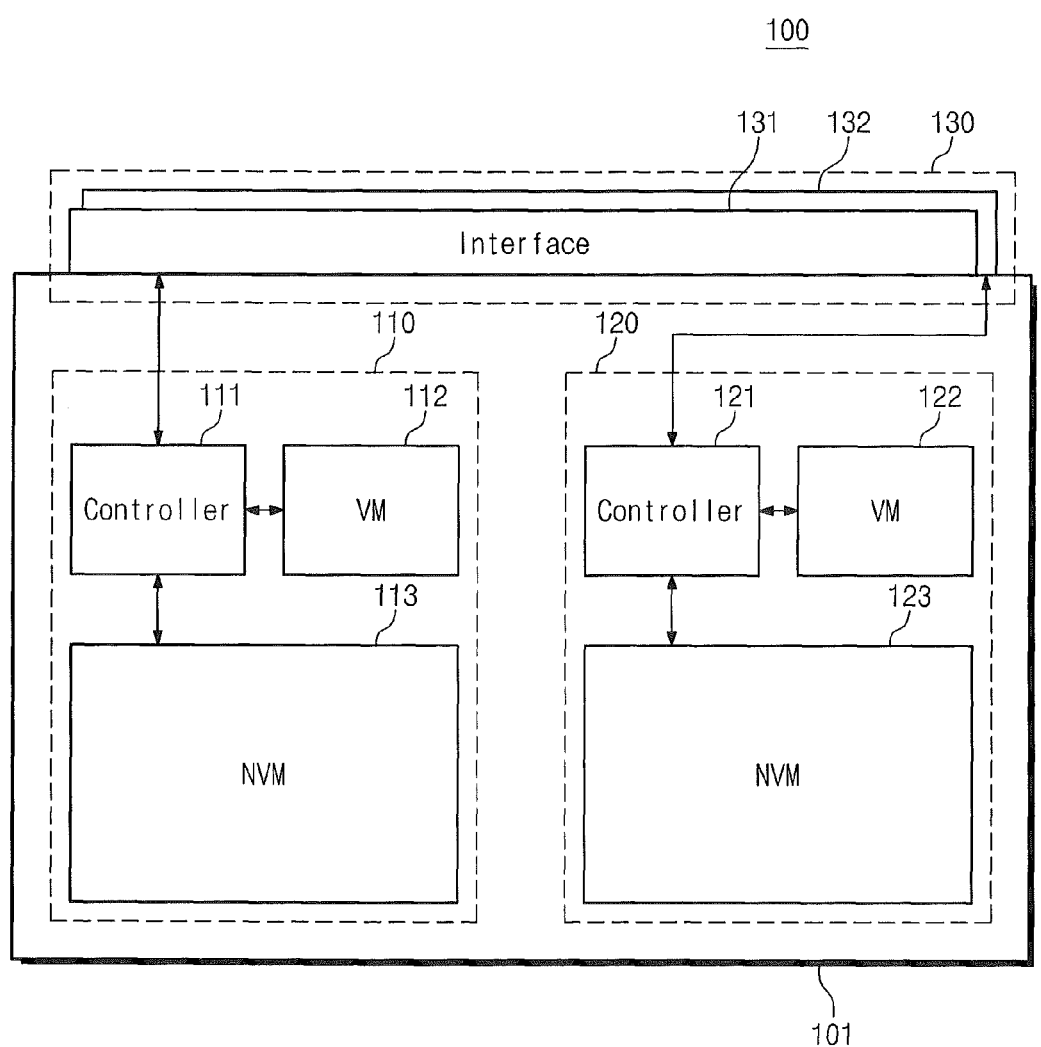
FIG. 1 is a block diagram schematically illustrating an information storing device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being on a "top" surface or a "bottom" surface would then be oriented on the opposite surface. Thus, the exemplary terms "top" and "bottom" can encompass both orientations. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present, Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating an information storing device according to an embodiment of the inventive concept. Referring to FIG. 1, an information storing device 100 includes a first memory unit 110, a second memory unit 120, and an interface unit 130. Operations and configurations of the first memory unit 110 are similar to those of the second memory unit 120. Thus, the description of the first memory unit 110 can also apply to the second memory unit 120 in an analogous fashion.

The information storing device 100 is formed on a substrate 101. A substrate on which the information storing device 100 is formed may be a printed circuit board (PCB). The information storing device 100 may be a solid state drive (SSD). The PCB can be formed of many different materials that can be arranged to provide the desired electrical isolation and high thermal conductivity. In some embodiments, the PCB can at least partially comprise a dielectric to provide the desired electrical isolation.

For boards made of materials such a polyimides and polyesters, the boards can be flexible (sometimes referred to as a flexible printed circuit board). This can allow the board to take a non-planar or curved shape. In some embodiments according to the inventive concept, the board can be a flexible printed substrate such as a Kapton® polyimide available from Dupont.

In some embodiments, the board can include a dielectric layer to provide electrical isolation, while also comprising electrically neutral materials that provide good thermal conductivity. Different dielectric materials can be used for the dielectric layer including epoxy based dielectrics, with different electrically neutral, thermally conductive materials dispersed within it.

The first memory unit 110 is mounted on the substrate 101. The first memory unit 110 includes a first controller 111, a first volatile memory 112, and a first nonvolatile memory 113. It will be understood that the term "mounted on" as used herein includes configurations where the component is physically connected to the substrate without the use of intervening submounts, substrates, carriers, or other surfaces. Accordingly, components that are described as being "mounted on" a substrate can be on the same surface of a substrate, or on opposing surfaces of the same substrate. For example, components that are placed and soldered on the same substrate during assembly can be described as being "mounted on" that substrate.

The first controller 111 is electrically connected to the first volatile memory 112 and the first nonvolatile memory 113. The first controller 111 is connected to the interface unit 130 to control transmitting and receiving operations with an external host. The first controller 111 controls read and write operations of the first volatile memory 112 and the first nonvolatile memory 113.

The first volatile memory 112 is a system memory in which data may be temporarily stored. That is, the first volatile memory 112 is used as a buffer memory. In example embodiments, the first volatile memory 112 may be formed of a dynamic random access memory (DRAM).

The first nonvolatile memory 113 is used to back up data stored in the first volatile memory 112. In example embodiments, the first nonvolatile memory 113 may be formed of a flash memory (e.g., a NAND flash memory or a NOR flash memory), EPROM, EEPROM, FRAM, MRAM, PRAM, SONOS, RRAM, or NRAM.

The interface unit 130 is connected to the first and second controllers 111 and 121 to allow data to be translated between the interface formats (protocols) of the host and that of the first and second memory units 110 and 120. In example embodiments, the host may be an apparatus such as a computer, a cellular phone, a PDA, a digital camera, a camcorder, a voice recorder, an MP 3 6player, a handheld PC, a gamine console, a facsimile, a scanner, a printer, or the like.

The interface unit 130 may be formed using a tape automated bonding (TAB) process to so that the corresponding circuits are formed on one side of the printed circuit board 101. The interface unit 130 may be configured to use an interface format such as USB (Universal Serial Bus), SCSI (Small Computer System Interface), PCI express, ATA (Advanced Technology Attachment), PATA (Parallel ATA), SATA (Serial ATA), SAS (Serial Attached SCSI), or the like. It will be understood that the interface units can spaced apart from one another and extend along an edge of the printed circuit board.

The interface unit 130 includes a first interface 131 and a second interface 132. The first and second interfaces 131 and 132 may be formed in a layered manner, as described herein.

Figure 2:
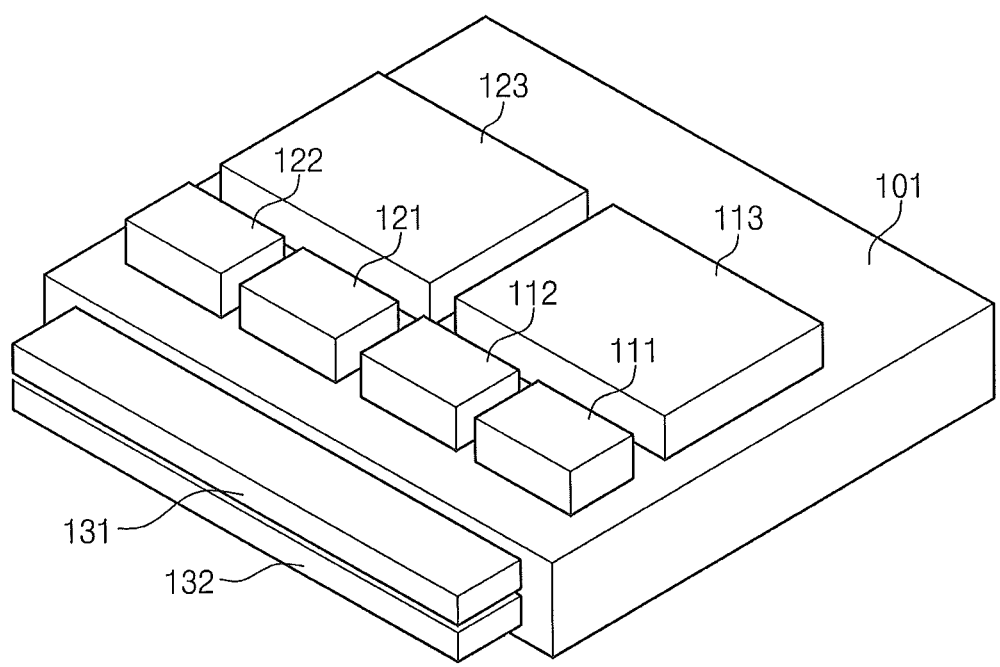
FIG. 2 is a perspective view of an information storing device in FIG. 1.

FIG. 2 is a perspective view of an information storing device in FIG. 1. Referring to FIG. 2, a first interface 131 and a second interface 132 are formed on one side of a printed circuit board in a stacked manner. The interface unit can include multiple interfaces to allow the width of the information storing device to be reduced.

When the interface unit 130 is formed in a layered manner and the memory units 110 and 120 are mounted on a single surface, the information storing device 100 may be thin compared to when the memory units are mounted on both (opposing) surfaces.

Returning to FIG. 1, the first interface 131 is connected to a first controller 111. The first interface 131 sends and receives data (e.g., control signals, addresses, etc.) to and from a host. The first interface 131 converts data received from the host into an internal signal to send it to the first controller 111. The second interface 132 is connected to a second controller 121 to operate the same as described in relation to the first interface 131.

The overall operating speed of the information storing device 100 may be affected the speed at which information is transferred to the interface unit 130 from the host via a bus, by the speed at which the memory units 110 and 120 perform read and write operations in response to the internal signal received from the interface unit 130. In some embodiments, improved speed may be provided by the capabilities of the memory units to operate and communicate with the host simultaneously. For example, the first memory unit 110 may receive data from the host while the second memory unit 120 also received data from the host. Moreover, operations within the memory units 110 and 120 may be carried out independent of one another.

In example embodiments, the memory units 110 and 120 and the interface unit 130 of the information storing device 100 may perform operations in parallel. In the information storing device 100, data from the host may be sent to the first and second interfaces 131 and 132 in parallel.

The first interface 131 is connected to the first controller 111 to control data reading and writing operations of the first memory unit 110, and the second interface 132 is connected to the second controller 121 to control data reading and writing operations of the second memory unit 120.

The information storing device 100 according to the inventive concept may operate at high speed compared to a structure having one memory unit and an interface, due to the plurality of memory units and the interfaces over which the host can transfer data.

Figure 3:
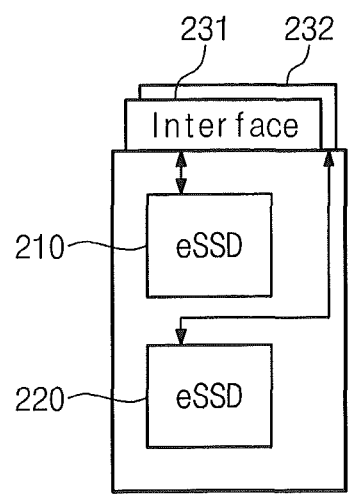
FIG. 3 is a diagram schematically illustrating an information storing device according to another embodiment of the inventive concept.

FIG. 3 is a diagram schematically illustrating an information storing device according to another embodiment of the inventive concept. Referring to FIG. 3, an information storing device 200 includes a first embedded SSD (hereinafter, referred to as an eSSD) 210, a second eSSD 220, a first interface 231, and a second interface 232.

The eSSD is a storage device in which a controller, a volatile memory, and a nonvolatile memory are integrated within a single package, and not mounted independently. Compared to a structure where a controller, a volatile memory, and a nonvolatile memory are mounted independently, the eSSD may provide high performance and use less area although the storage capacity of the nonvolatile memory maybe reduced.

Like an information storing device 100 in FIG. 1, the first interface 231 is connected to the first eSSD 210 to control data reading and writing operations of the first eSSD 210, and the second interface 232 is connected to the second eSSD 220 to control data reading and writing operations of the second eSSD 220.

The information storing device 200 according to the inventive concept may operate at high speed compared to a structure having one eSSD and an interface due to the parallel connection of the interfaces with the host.

Compared to that in FIG. 1, the size of the information storing device 200 becomes small because an eSSD is used instead of independent mounting of a controller and a memory. In this case, the capacity of the information storing device 200 may be reduced, while being provided in a small form factor (SFF).

Figure 4:
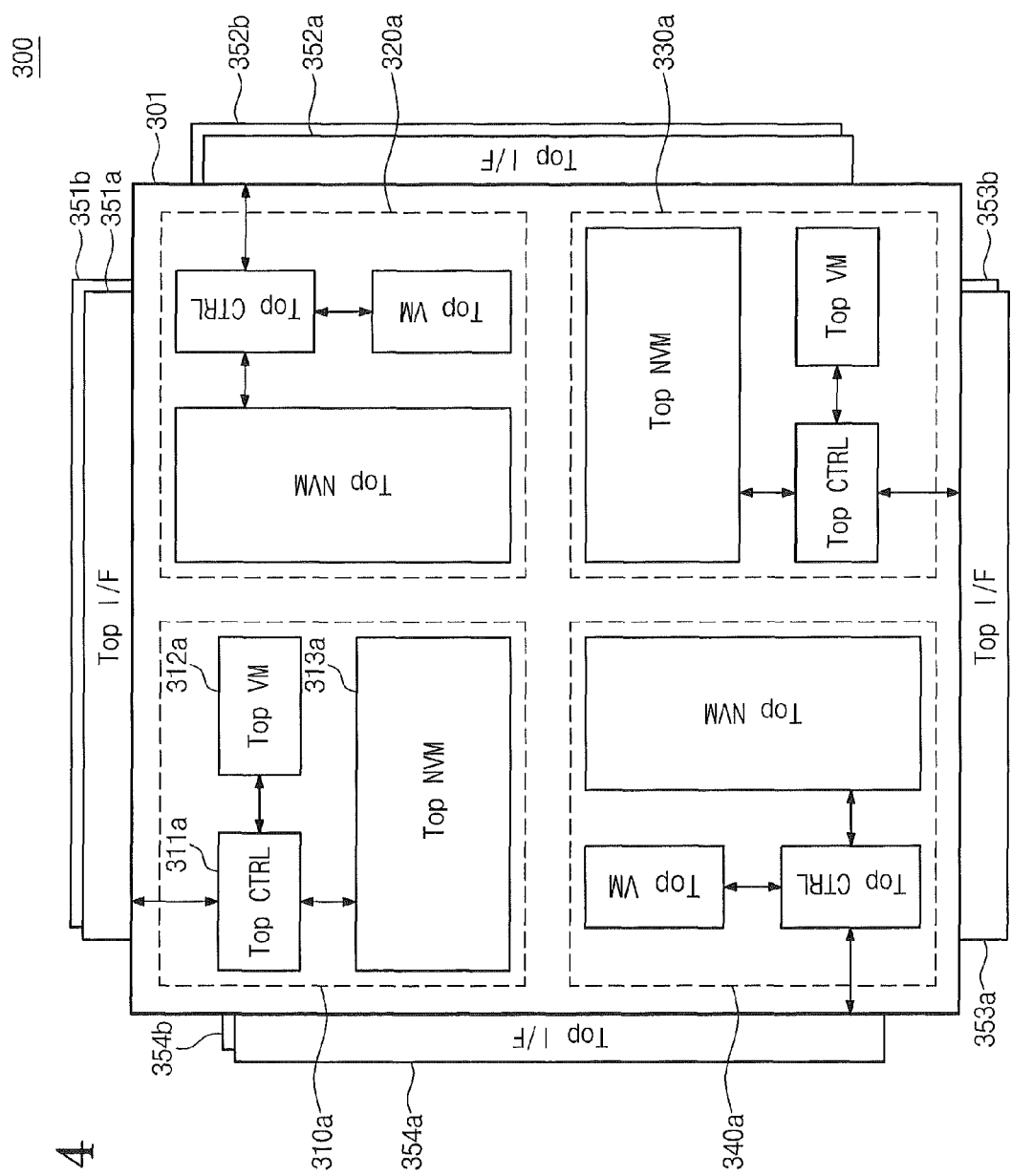
FIG. 4 is a top view of an information storing device according to still another embodiment of the inventive concept.
Figure 5:
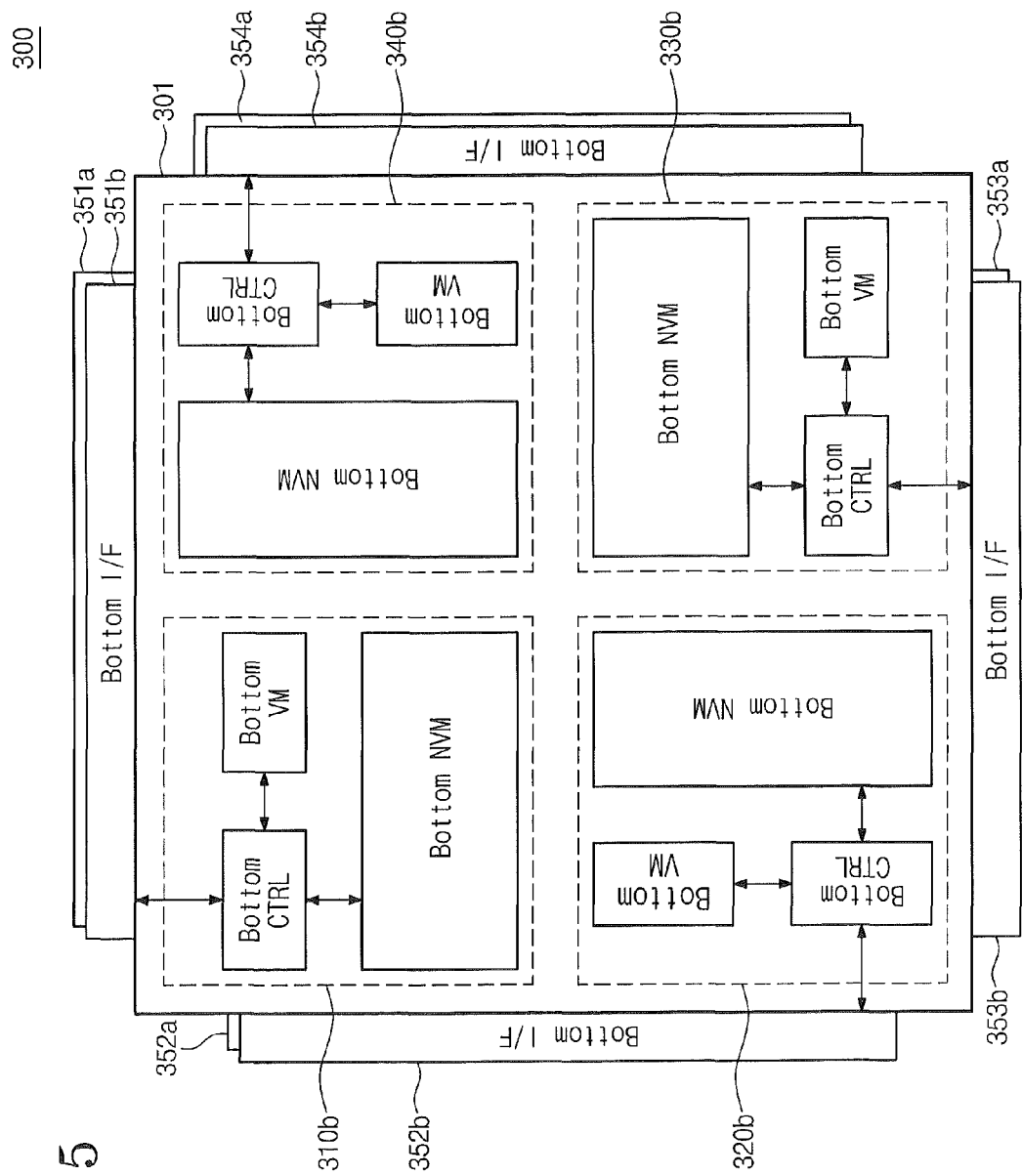
FIG. 5 is a bottom view of an information storing device in FIG. 4.

FIG. 4 is a top view of an information storing device according to still another embodiment of the inventive concept. FIG. 5 is a bottom view of an information storing device in FIG. 4.

Referring to FIGS. 4 and 5, an information storing device 300 includes a first top memory unit 310a to a fourth top memory unit 340a, a first bottom memory unit 310b to a fourth bottom memory unit 340b, a first top interface 351a to a fourth top interface 354a, and a first bottom interface 351b to a fourth bottom interface 354b. The memory units 310a to 340a and 310b to 340b may be similar in terms of operations and configurations. Thus, only the first top memory unit 310a will be described.

Like a first memory unit 110 in FIG. 1, the first top memory unit 310a is mounted on a substrate 301. The first top memory unit 310a includes a first controller 311a, a first volatile memory 312a, and a first nonvolatile memory 313a. It will be understood that the other memory units shown in FIGS. 4 and 5, each include each corresponding controllers, volatile memories, and non-volatile memories interconnected as shown and operating in an analogous fashion.

The first controller 311a is electrically connected to the first volatile memory 312a and the first nonvolatile memory 313a. The first controller 311a is connected to the first interface 351a to control data transmitting and receiving operations with an external host. The first controller 311a controls read and write operations of the first volatile memory 312a and the first nonvolatile memory 313a.

The first interface 351a sends and receives data (e.g., control signals, addresses, etc.) to and from a host. The first interface 351a converts data received from the host into an internal signal to send it to the first controller 311a.

The top interfaces and the bottom interfaces are formed in a layer structure. In an information storing device having an interface unit including multiple interfaces, there is reduced a width occupied by the interface unit.

In example embodiments, like an information storing device 100, the memory units 310a to 340a and 310b to 340b and the interfaces 351a to 354a and 351b to 354b of the information storing device 300 may perform operations in parallel. In the information storing device 300, data from the host may be sent to the interfaces 351a to 354a and 351b to 354b in parallel.

The top interface 351a of the information storing device 300 is connected to the first controller 311a to control data reading and writing operations of the first top memory unit 310a, and the interfaces 352a to 354a and 351b to 354b of the information storing device 300 are connected to corresponding controllers to control data reading and writing operations of corresponding memory units.

Since the host is connected in to the information storing device 100 via parallel memory units and interfaces, the information storing device 300 according to the inventive concept may operate at high speed compared to a structure having one memory unit and an interface.

Figure 6:
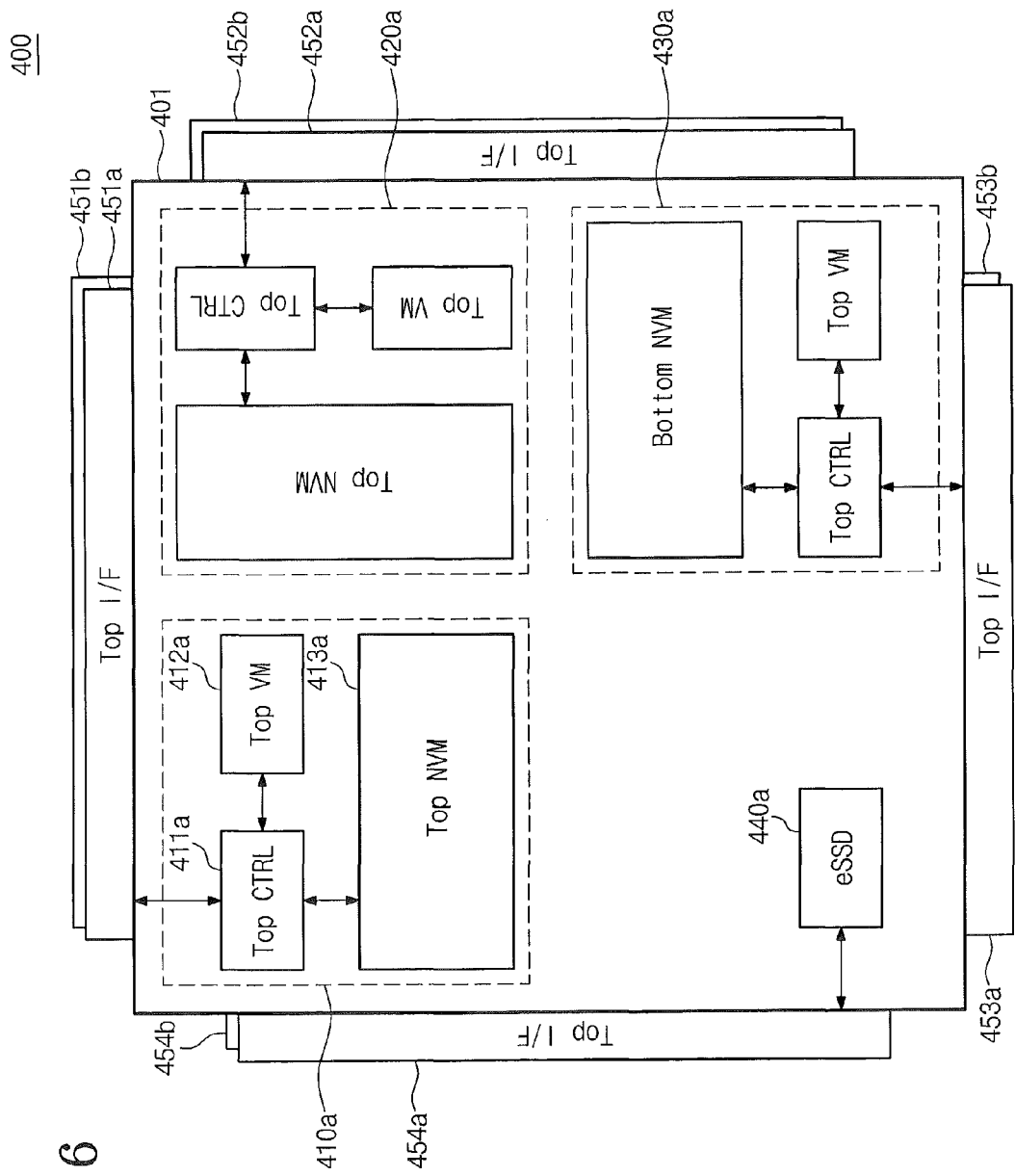
FIG. 6 is a top view of an information storing device according to still another embodiment of the inventive concept.

FIG. 6 is a top view of an information storing device according to still another embodiment of the inventive concept. In FIG. 6, an information storing device 400 is identical to that in FIG. 4 except that a fourth top memory unit 340a is replaced with a first eSSD 440a, and description thereof is thus omitted.

Like a first top memory unit 310a in FIG. 4, a first top memory unit 410a is mounted on a substrate 401. The first top memory unit 410a includes a first top controller 411a, a first top volatile memory 412a, and a first top nonvolatile memory 413a. It will be understood that the other memory units shown in FIG. 6, each include each corresponding controllers, volatile memories, and non-volatile memories interconnected as shown and operating in an analogous fashion.

The first top controller 411a is electrically connected to the first top volatile memory 412a and the first top nonvolatile memory 413a. The first top controller 411a is connected to the first top interface 451a to control data transmitting and receiving operations with an external host. The first top controller 411a controls data reading and writing operations of the first top volatile memory 412a and the first top nonvolatile memory 413a.

The first top interface 451a receives and sends data (e.g., control signals, addresses, etc.) from and to the host. The first top interface 451a converts data received from the host into an internal signal to send it to the first top controller 411a.

The first eSSD 440a is connected to a fourth top interface 454a. The fourth top interface 454a is connected to the first eSSD 440a to control data reading and writing operations of the first eSSD 440a.

While having the capacity less than memory units, the first eSSD 440a may be faster. The first eSSD 440a may be used as a booting memory according to a host. Memory units may be used as a main memory, that is, a memory for storing main basic data. The information storing device 400 may be implemented as a storage device that provides fast booting.

In example embodiments, the inventive concept is described using an example that seven memory units packed independently and an eSSD are combined. However, the inventive concept is not limited thereto. For example, the inventive concept is applicable to all combination of at least one packed memory unit and at least one eSSD.

Figure 7:
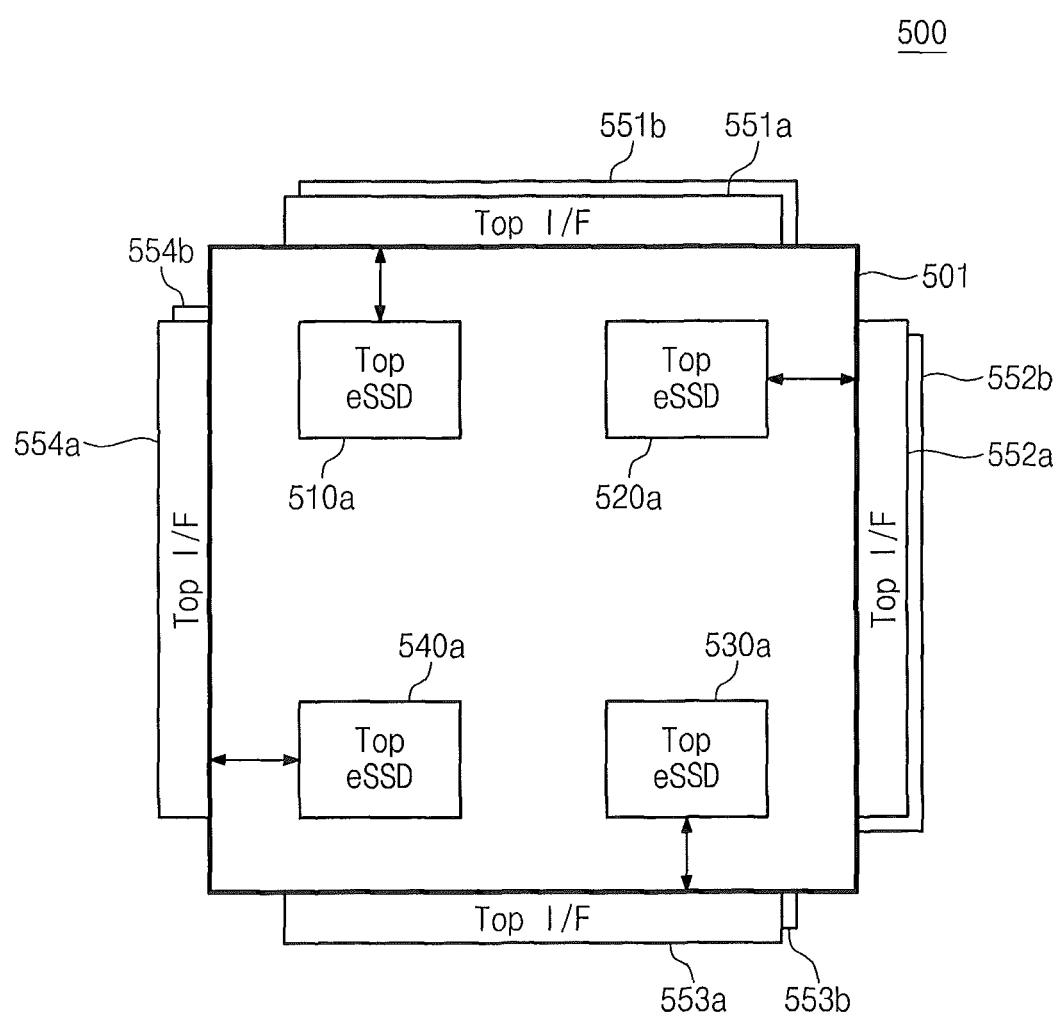
FIG. 7 is a top view of an information storing device according to still another embodiment of the inventive concept.
Figure 8:
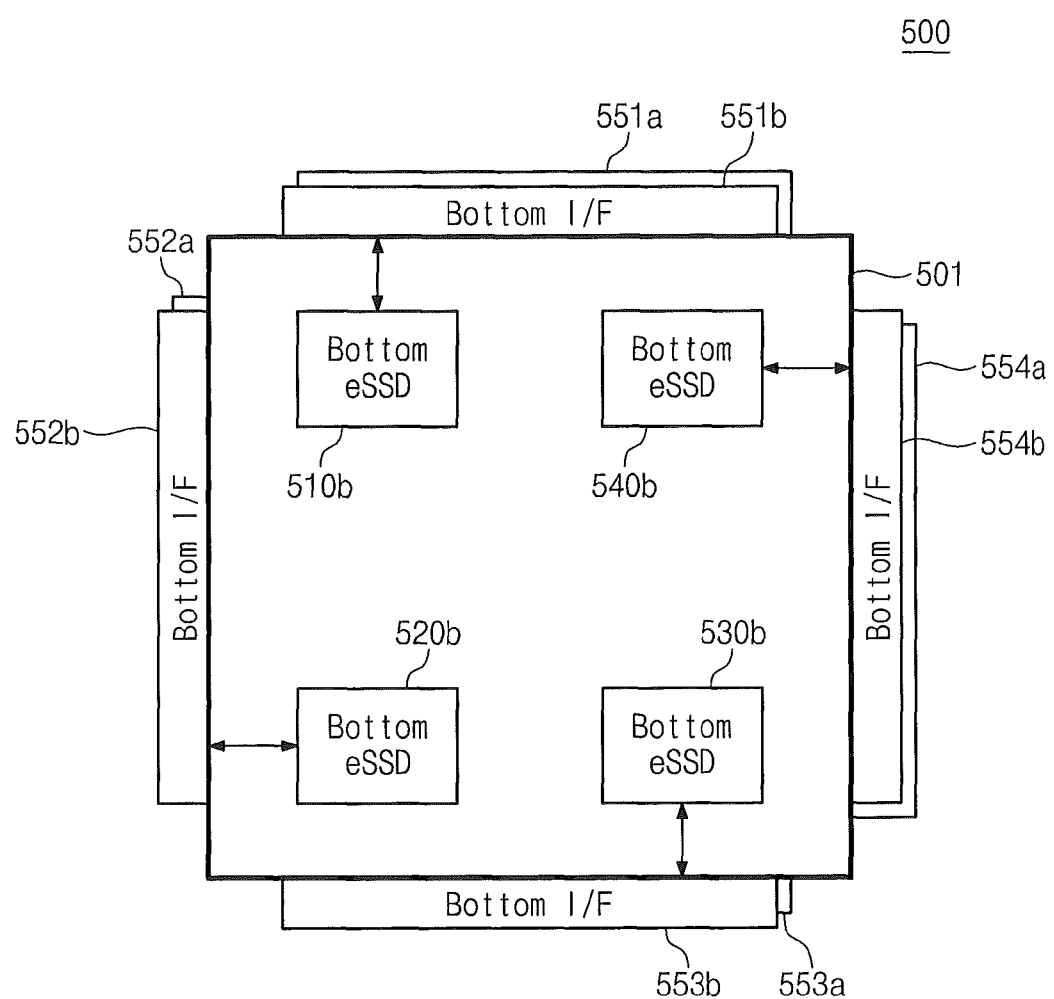
FIG. 8 is a bottom view of an information storing device in FIG. 7.

FIG. 7 is a top view of an information storing device according to still another embodiment of the inventive concept. FIG. 8 is a bottom view of an information storing device in FIG. 7.

Referring to FIGS. 7 and 8, an information storing device 500 includes a first top eSSD 510a to a fourth top eSSD 540a, a first bottom eSSD 510b to a fourth bottom eSSD 540b, a first top interface 551a to a fourth top interface 554a, and a first bottom interface 551b to a fourth bottom interface 554b. The information storing device 500 in FIG. 7 is equal to that in FIG. 4 except that all memory units are replaced with an eSSD, and description thereof is thus omitted.

The eSSDs 510a to 540a and 510b to 540b are similar to one another in operation and configuration. Thus, the description of the first top eSSD 510a will be applicable to the other eSSDs shown. The first top eSSD 510a is connected to the first top interface 551a. The first top interface 551a is connected to the first top eSSD 510a to control data reading and writing operations of the first top eSSD 510a.

Since connected in parallel to a host via a plurality of eSSDs and a plurality of interfaces, the information storing device 500 according to the inventive concept may operate at higher speed than a structure having one eSSD and an interface.

As described above, compared with a memory unit, the eSSD has high performance and less area although it may have less capacity due to the small size of the nonvolatile memory therein. Compared with an information storing device 300 in FIG. 4, the size of the information storing device 500 becomes small because an eSSD is used instead of independent mounting of a controller and a memory. In this case, the capacity of the information storing device 500 may be small, but may have a small form factor (SFF).

In example embodiments, the inventive concept is described using an example that eight eSSDs are mounted on both surfaces (i.e., four on each side). However, the inventive concept is not limited thereto. For example, the inventive concept is applicable to all information storing devices where two or more eSSDs are mounted on both surfaces.

Figure 9:
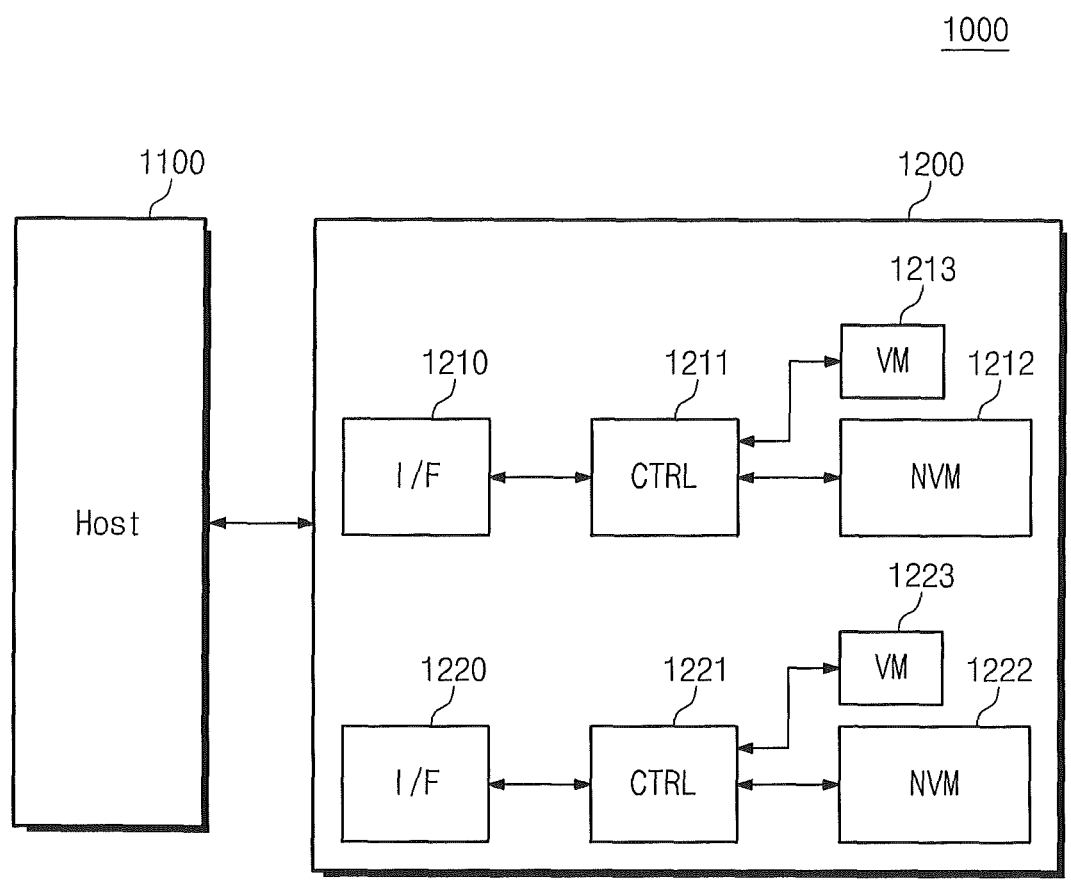
FIG. 9 is a block diagram schematically illustrating a user device according to an embodiment of the inventive concept.

FIG. 9 is a block diagram schematically illustrating a user device according to an embodiment of the inventive concept. Referring to FIG. 9, a user device 1000 includes a host 1100 and an information storing device 1200.

The host 1100 writes data in the information storing device 1200 or reads data therefrom. The host 1100 may provide the information storing device 1200 with a command (e.g., a read or write command) and data.

The information storing device 1200 includes first and second interfaces 1210 and 1220, first and second controllers 1211 and 1221, and first and second nonvolatile memories 1212 and 1222 and, optionally, first and second volatile memories 1213 and 1223.

The first and second interfaces 1210 and 1220 may enable parallel data exchange between the host 1100 and the information storing device 1200. The first interface 1210 is connected to the first controller 1211 to control data reading and writing operations of the first nonvolatile memory 1212 and first volatile memory 1213. The second interface 1220 is connected to the second controller 1221 to control data reading and writing operations of the second nonvolatile memory 1222 and second volatile memory 1223.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. An information storing device comprising:
   a printed circuit board having first and second opposing sides with a side edge of the printed circuit board located at an outermost edge of the printed circuit board and connecting the first and second opposing sides;
   a first interface configured to connect to a host, the first interface located on a surface of the side edge of the printed circuit board;
   a second interface configured to connect to the host, the second interface located on the surface of the side edge of the printed circuit board alongside the first interface and spaced apart from the first interface to provide a gap between the first and second interfaces;
   a first memory unit including a first controller configured to control a first nonvolatile memory, the first controller further configured to communicate with the host via the first interface; and
   a second memory unit including a second controller configured to control a second nonvolatile memory, the second controller further configured to communicate with the host via the second interface, wherein the first and second interfaces are configured to simultaneously communicate with the host responsive to the first and second memory units, respectively.

2. The information storing device of claim 1, wherein the first memory unit further includes a first buffer memory configured to temporarily store data received from the host, and the second memory unit further includes a second buffer memory configured to temporarily store data received from the host.

3. The information storing device of claim 2, wherein the information storing device comprises a solid state drive.

4. The information storing device of claim 1, wherein the first interface comprises a serial ATA interface.

5. The information storing device of claim 1, wherein the first interface and the second interface are recessed relative to the first and second opposing sides.

6. The information storing device of claim 1, wherein the first interface and the second interface are disposed on the surface of the side edge of the printed circuit board in a stacked manner.

7. An information storing device comprising:
   a printed circuit board having first and second opposing sides with a side edge of the printed circuit board located at an outermost edge of the printed circuit board and connecting the first and second opposing sides;
   a first interface configured to connect with a host, the first interface located on a surface of the side edge of the printed circuit board;
   a second interface configured to connect with the host, the second interface located on the surface of the side edge of the printed circuit board alongside the first interface and spaced apart from the first interface to provide a gap between the first and second interfaces;

a first memory unit mounted on the printed circuit board and including a first controller configured to control a first nonvolatile memory, the first controller further configured to communicate with the host via the first interface; and a second memory unit mounted on the printed circuit board and including a second controller configured to control a second nonvolatile memory, the second controller further configured to communicate with the host via the second interface, wherein the first and second interfaces are configured to simultaneously communicate with the host responsive to the first and second memory units, respectively.

8. The information storing device of claim 7, wherein the first and second interfaces are formed with Tape Automated Bonding.

9. The information storing device of claim 7, wherein the first and second memory units are mounted on a single surface of the printed circuit board.

10. The information storing device of claim 7, wherein the first and second memory units are mounted on opposite surfaces of the printed circuit board, respectively.

11. The information storing device of claim 7, wherein the first memory unit further includes a first buffer memory configured to temporarily store data received from the host, the first controller, the first nonvolatile memory, and the first buffer memory being integrated in a first package, and the second memory unit further includes a second buffer memory configured to temporarily store data received from the host, the second controller, the second nonvolatile memory, and the second buffer memory being integrated in a second package.

12. The information storing device of claim 7, wherein the first memory unit further includes a first buffer memory configured to temporarily store data received from the host, the first controller, the first nonvolatile memory, and the first buffer memory being packaged separately, and the second memory unit further includes a second buffer memory configured to temporarily store data received from the host, the second controller, the second nonvolatile memory, and the second buffer memory being packaged separately.

13. The information storing device of claim 7, wherein the first memory unit further includes a first buffer memory configured to temporarily store data received from the host, the first controller, the first nonvolatile memory, and the first buffer memory being packaged separately, and the second memory unit further includes a second buffer memory configured to temporarily store data received from the host, the second controller, the second nonvolatile memory, and the second buffer memory being integrated in a package.

14. The information storing device of claim 13, wherein the first memory unit is configured for use as a main memory and the second memory unit is configured for use as a booting memory.

15. A user device comprising:
an information storing device; and
a host configured to communicate with the information storing device,
wherein the information storing device comprises:
a printed circuit board having first and second opposing sides with a side edge of the printed circuit board located at an outermost edge of the printed circuit board and connecting the first and second opposing sides;
first and second interfaces on the printed circuit board and configured to connect with the host, the first and second interfaces located on a surface of the side edge of the printed circuit board alongside and spaced apart from one another to provide a gap between the first and second interfaces;
a first memory unit including a first nonvolatile memory and a first controller configured to control the first nonvolatile memory, the first controller further configured to communicate with the host via the first interface; and
a second memory unit including a second nonvolatile memory and a second controller configured to control the second nonvolatile memory, the second controller further configured to communicate with the host via the second interface, wherein the first and second interfaces are configured to simultaneously communicate with the host responsive to the first and second memory units, respectively.

16. The user device of claim 15, wherein the first memory unit further includes a first buffer memory configured to temporarily store data received from the host via the first interface, and the second memory unit further includes a second buffer memory temporarily storing data received from the host via the second interface, the first memory unit and the second memory unit being packaged separately.

17. An information storing device comprising:
a printed circuit board having first and second opposing sides with a side edge of the printed circuit board located at an outermost edge of the printed circuit board and connecting the first and second opposing sides;
a first interface, on a first surface of the side edge of the printed circuit board, configured to connect with a host that is external to the information storing device;
a second interface configured to separately connect with the host, the second interface located on the first surface of the side edge of the printed circuit board alongside the first interface and spaced apart from the first interface to provide a gap between the first and second interfaces;
a first memory unit on the printed circuit board, including a first nonvolatile memory, the first memory unit configured to communicate with the host via the first interface;
a second memory unit on the printed circuit board, including a second nonvolatile memory, the second memory unit configured to communicate with the host via the second interface simultaneously with communication between the host and the first memory unit;
a third interface, on the printed circuit board, configured to connect with the host;
a fourth interface, on the printed circuit board, spaced apart from the third interface and configured to separately connect with the host, the third and fourth interfaces are spaced apart along a second surface of the side edge of the printed circuit board to provide a gap between the third and fourth interfaces;
a third memory unit on the printed circuit board, including a third nonvolatile memory, the third memory unit configured to communicate with the host via the third interface; and
a fourth memory unit on the printed circuit board, including a fourth nonvolatile memory, the fourth memory unit configured to communicate with the host via the fourth interface simultaneously with communication between the host and the first, second, and third memory units.

18. The information storing device of claim 17 wherein the third and fourth memory units are mounted on the first side of the printed circuit board.

19. The information storing device of claim 17 wherein the third and fourth memory units are mounted on opposite sides of the printed circuit board.

20. The information storing device of claim 17 wherein the third and fourth interfaces comprise tape automated bonding interfaces.

\* \* \* \* \*